United States Patent
Botti et al.

(10) Patent No.: US 7,813,515 B2
(45) Date of Patent: Oct. 12, 2010

(54) MULTI-CHANNEL POWER AMPLIFIER WITH CHANNELS INDEPENDENTLY SELF-CONFIGURING TO A BRIDGE OR SINGLE-ENDED OUTPUT, PARTICULARLY FOR AUDIO APPLICATIONS

(75) Inventors: Edoardo Botti, Vigevano (IT); Fabio Cagnetti, Corsico (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 1743 days.

(21) Appl. No.: 10/865,039

(22) Filed: Jun. 9, 2004

(65) Prior Publication Data

US 2005/0025323 A1 Feb. 3, 2005

(30) Foreign Application Priority Data

Jun. 9, 2003 (EP) .................................. 03425358

(51) Int. Cl.
*H03F 99/00* (2009.01)

(52) U.S. Cl. ..................... 381/120; 381/28; 381/123; 330/51; 330/84; 330/124 R; 330/146; 330/295

(58) Field of Classification Search ............... 381/28, 381/120, 123, 59, 81, 84–85; 330/51, 84, 330/124, 146, 295, 251, 251 R See application file for complete search history.

(56) References Cited

U.S. PATENT DOCUMENTS 3,881,058 A * 4/1975 Klauck ...................... 381/120

(Continued)

FOREIGN PATENT DOCUMENTS

EP 0 425 878 5/1991

(Continued)

OTHER PUBLICATIONS

European Search Report for EP 03 42 5358 dated Nov. 24, 2003.

(Continued)

*Primary Examiner*—Xu Mei
*Assistant Examiner*—Disler Paul
(74) *Attorney, Agent, or Firm*—Lisa K. Jorgenson; Kevin D. Jablonski; Graybeal Jackson LLP

(57) ABSTRACT

A multi-channel power amplifier for driving a plurality of loads, each associated with a respective channel, each channel comprising a pair of operational amplifiers, first and second, one operational amplifier of each channel being connectable by configuring switches either in a bridge configuration with the other operational amplifier or in single-ended configuration to a constant reference voltage output by a dedicated voltage buffer of the multi-channel amplifier for driving the respective load of the channel, comprises a window comparator for monitoring the level of the input signal of the channel and producing a logic control signal for the configuring switches.

Each channel has a dedicated window comparator monitoring the level of the input signal of the channel that generates a logic signal for positioning the switches that configure the output power structure of the channel in single-ended or bridge configuration. Moreover, instead of configuring one of the operational amplifiers to function as a reference voltage buffer when switching to a single-ended configuration, a distinct voltage reference buffer is employed, to which any single-ended channel of the multi-channel amplifier is connected.

20 Claims, 10 Drawing Sheets

U.S. PATENT DOCUMENTS

| | | | |
|---|---|---|---|
| 3,944,941 A | | 3/1976 | Tsuda |
| 4,330,756 A | | 5/1982 | Moreau |
| 4,494,077 A | | 1/1985 | Fukaya et al. |
| 4,894,621 A | | 1/1990 | Koenig et al. |
| 5,059,920 A | * | 10/1991 | Anderson et al. ........... 330/253 |
| 5,101,170 A | | 3/1992 | Torazzina et al. |
| 5,194,821 A | * | 3/1993 | Brambilla et al. ............. 330/51 |
| 5,194,824 A | * | 3/1993 | Wu et al. .................... 330/255 |
| 5,365,188 A | * | 11/1994 | Botti et al. .................... 330/51 |
| 5,414,774 A | | 5/1995 | Yumoto |
| 5,621,352 A | * | 4/1997 | Botti et al. .................... 330/51 |
| 5,648,742 A | | 7/1997 | Ghaffaripour et al. |
| 5,654,688 A | | 8/1997 | Allen et al. |
| 5,708,390 A | | 1/1998 | Dunnebacke |
| 5,729,174 A | * | 3/1998 | Dunnebacke et al. ......... 330/51 |
| 5,973,368 A | | 10/1999 | Pearce et al. |
| 6,552,607 B1 | | 4/2003 | Danielson |
| 6,563,377 B2 | | 5/2003 | Butler |
| 7,167,047 B2 | | 1/2007 | Botti et al. |
| 7,230,482 B2 | * | 6/2007 | Chelli et al. .................. 330/69 |
| 2002/0097086 A1 | | 7/2002 | Huijser |
| 2002/0125941 A1 | | 9/2002 | Nguyen |
| 2003/0206058 A1 | | 11/2003 | Paul et al. |
| 2004/0004517 A1 | | 1/2004 | Ruha et al. |
| 2004/0227567 A1 | | 11/2004 | Llewellyn |
| 2004/0232978 A1 | | 11/2004 | Easson et al. |
| 2005/0025323 A1 | * | 2/2005 | Botti et al. .................. 381/120 |
| 2005/0068103 A1 | | 3/2005 | Dupuis et al. |

FOREIGN PATENT DOCUMENTS

| | | |
|---|---|---|
| EP | 0 840 444 | 5/1998 |
| JP | 07 154160 | 6/1995 |

OTHER PUBLICATIONS

European Search Report for EP 03 42 5357 dated Nov. 25, 2003.

* cited by examiner

MULTI-CHANNEL POWER AMPLIFIER WITH CHANNELS INDEPENDENTLY SELF-CONFIGURING TO A BRIDGE OR SINGLE-ENDED OUTPUT, PARTICULARLY FOR AUDIO APPLICATIONS

PRIORITY CLAIM

This application claims priority from European patent application No. 03425358.3, filed Jun. 9, 2003, which is incorporated herein by reference.

CROSS REFERENCE TO RELATED APPLICATIONS

This application is related to U.S. patent application Ser. No. 10/865,030 entitled MULTI-CHANNEL POWER AMPLIFIER SELF-CONFIGURING TO A BRIDGE OR SINGLE-ENDED OUTPUT, PARTICULARLY FOR AUDIO APPLICATIONS, which has a common filing date and owner, and which is incorporated by reference.

TECHNICAL FIELD

Embodiments of the present invention relate in general to amplifiers and in particular to amplifiers with a reduced power consumption specially for car audio and HI-FI audio applications.

BACKGROUND

In many applications and primarily in audio reproduction systems, for example in car audios, HI-FI audio systems and similar apparatuses that are intrinsically compact because of stringent installation requirements, as well as in portable apparatuses, power dissipation in final power stages, often quadrupled in order to drive a pair of loudspeakers (front and rear) for each stereo channel, may create heat balance problems. For example, four 20 W amplifiers may have a power dissipation of about 4×12=48 W and because of the limited space available in certain apparatuses, such a relatively large power may be difficult to dissipate without a significant increase of temperature within the apparatus.

On the other hand, a relatively high temperature of operation may degrade the magnetic tape of cassettes or optical disks (CD), the drives of which are often tightly fitted inside a single apparatus case.

The so-called D-type switching amplifiers are highly efficient and are considered the most appropriate type for these applications.

Unfortunately, switching amplifiers generate electromagnetic emissions that in compact apparatuses may interfere with the correct functioning of other systems, reducing their performances. For these reasons, audio signals are frequently amplified using a pair of class AB power amplifiers, operating in single-ended or in bridge configuration depending on the level of the processed signal.

In fact, class AB power amplifiers are less efficient than switching amplifiers and a common technique for reducing power consumption of class AB amplifiers consists in configuring them in single-ended instead of in bridge configuration, whenever it is possible to do so. In fact, these amplifiers dissipate more power in bridge configuration than in single-ended configuration as long as the amplitude of the output signal remains smaller than the positive supply voltage. Unfortunately, it is not possible to use single-ended class AB amplifiers if the output surpasses this voltage because the output signal would be severely distorted by clipping.

Techniques for automatically switching from one configuration to the other in function of the monitored level of the signal are implemented in the commonly owned U.S. Pat. No. 5,194,821, U.S. Pat. No. 5,365,188 and U.S. Pat. No. 5,654,688.

The U.S. Pat. No. 5,194,821 discloses a bridge amplifier using a positive and a negative supply voltage sources, that may function in single-ended or in differential or bridge output configuration, depending on the level of the output signal. Substantially, a comparator changes the output circuital configuration of the amplifier from a bridge configuration to a single-ended configuration or vice versa by closing or opening configuring switches, when the output signal becomes smaller than or greater than a certain threshold voltage.

The U.S. Pat. No. 5,365,188 and U.S. Pat. No. 5,654,688 disclose a single supply dual bridge power amplifier, having a window comparator for sensing the level of input signals fed to the amplifier and driving the switches that coordinately configure the amplifier in either a bridge or in a single-ended configuration.

A system of the type disclosed in the above mentioned patents is schematically shown in FIG. 1.

Four operational amplifiers OP1+, OP1−, OP2+, OP2− are respectively input with the signals Ch1 and Ch2 for driving two loudspeakers. A window comparator is input with the two signals Ch1 and Ch2 and positions the switches that connect the loudspeaker of the channel Ch2 either to the output of the operational amplifier (OP2+) or to a certain reference voltage $V_{REF}$. The operational amplifier OP1− is configured by the window comparator that positions the path-selector shown within the dotted perimeter for functioning as a voltage buffer outputting the reference voltage $V_{REF}$, by coupling an input thereof to a fixed voltage $V_F$.

In the scheme of FIG. 1, the switches of the power amplifier are shown in the position that configures the amplifier with two single-ended channels driving the respective loudspeakers.

In car audio systems two or more pairs of amplifiers of this kind are often used for driving four loudspeakers FR (Front Right), FL (Front Left), RR (Rear Right) and RL (Rear Left) through independently equalizable channels.

Surprisingly, it has been noticed that frequently the efficiency of this multi-channel power amplifier inexplicably drops and crosstalk effects increase.

SUMMARY

By investigating the possible causes of these baffling occurrences, it has been noticed that in most recently developed Hi-Fi car audio systems, correlation among the processed audio signals fed to the four channels FR, FL, RR and RL of the power amplifier may significantly decrease because of the different equalizations that may independently be set by the user and consequently of different delays of propagation of the signals through the respective channels.

It has been assumed that a probable cause of the loss of performance is the fact that the channels of the power amplifier according to the known practice function either all in bridge or all in single-ended configuration. This restraints means in practice that it may happen, for example, that the front right channel of a car audio system be switched from a single-ended to a bridge configuration (or vice versa) even if it would not be efficient for the channel to do so, because the change of configuration has become necessary for the rear right channel.

This important drawback is solved by the multi-channel power amplifier according to an embodiment of this invention.

According to this embodiment, each channel has a dedicated window comparator monitoring the level of the input signal of the channel that generates a logic signal for positioning the switches that configure the output power structure of the channel in single-ended or bridge configuration. Moreover, instead of configuring one of the operational amplifiers to function as a reference voltage buffer when switching to a single-ended configuration, a distinct voltage reference buffer is employed, to which any single-ended channel of the multi-channel amplifier may be connected.

It has been proven that the performance in terms of power dissipation of this architecture of a multi-channel amplifier go well beyond the normally expected power saving by virtue of the fact that the channels may independently assume a single-ended configuration using the same dedicated voltage buffer.

More precisely, a multi-channel power amplifier for driving a plurality of loads, each associated with a respective channel, each channel comprising a pair of operational amplifiers, first and second, one operational amplifier of each channel being connectable by configuring switches either in a bridge configuration with the other operational amplifier or in single-ended configuration to a constant reference voltage output by a dedicated voltage buffer of the multi-channel amplifier for driving the respective load of the channel, and further comprising a window comparator for monitoring the level of the input signal of the channel and producing a logic control signal for the configuring switches.

BRIEF DESCRIPTION OF THE DRAWINGS

Different aspects and advantages of this invention will appear even more clear through the following non-limiting description of several embodiments and by referring to the annexed drawings, wherein.

DETAILED DESCRIPTION

Figure 3:
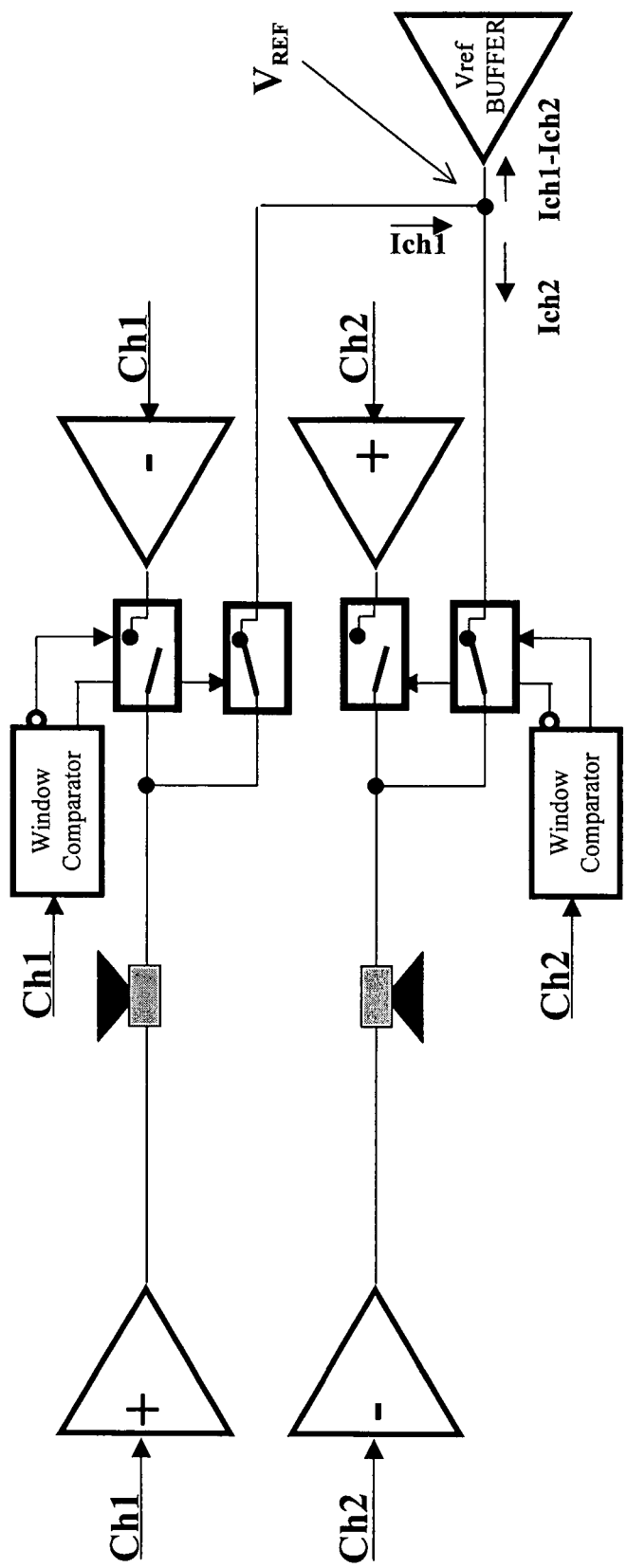
FIG. 3 depicts a two channel self-configuring power amplifier according to an embodiment of this invention.

A basic scheme of a self-configuring two channel power amplifier according to an embodiment of this invention is depicted in FIG. 3.

It includes beside two independently configurable output bridge structures for driving respective loads, which in this example are two loudspeakers, a dedicated unique voltage buffer Vref_BUFFER, distinct from the operational amplifiers, that outputs a reference voltage $V_{REF}$, and a dedicated window comparator sensing the level of the signal input to the channel and controlling the switches that configure the output of the channel in a bridge or single-ended configuration with the voltage buffer.

The output power structure of each channel comprises a pair of operational amplifiers, preferably functioning in class AB for keeping as low as possible electromagnetic emissions, that may be independently connected in a configuration equivalent to a bridge power amplifier or in a configuration equivalent to a single-ended power amplifier.

When the operational amplifiers of the same channel are connected in a single-ended configuration, according to the positioning of the configuring switches depicted in FIG. 3, the respective load is connected between the output of an operational amplifier and the output node at the constant reference voltage $V_{REF}$ of the voltage buffer Vref_BUFFER. The second operational amplifier is inactive. Conversely, the two operational amplifiers of a channel are connected in a bridge configuration when the positions of the respective configuring switches are inverted.

Instead of employing a switch for disconnecting the load from the output of the second operational amplifier, it is also possible to use an operational amplifier that may be placed in a high impedance output state (tristate). In this case, the relative window comparator commands the second operational amplifier of the channel to tristate when the load of the channel is driven in single-ended configuration, and releases the second operational amplifier from tristate when the load is driven through an output bridge.

The novel power amplifier of this embodiment of the invention is particularly advantageous in applications that require more than two channels, such as in advanced car audio applications.

While according to prior art approaches, realizing a window comparator for each channel and a dedicated voltage reference buffer and making each channel independently configurable from the others was regarded only as a waste of silicon area, it will be demonstrated hereinafter that a power amplifier made according to an embodiment of this invention is noticeably less power consuming than a comparable known power amplifier.

Figure 4:
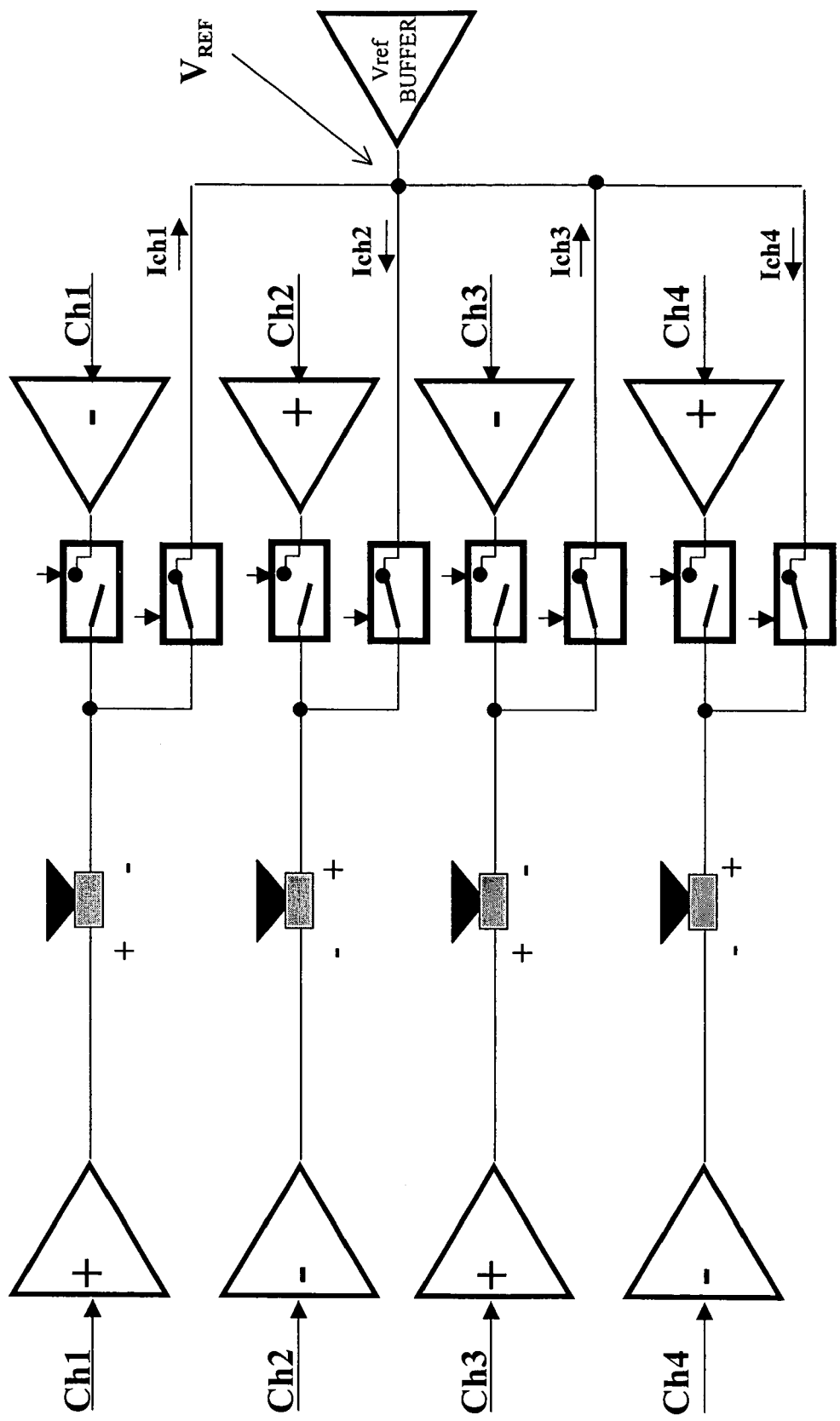
FIG. 4 depicts a four channel amplifier according to an embodiment of this invention connectable in single-ended or bridge configuration.
Figure 5:
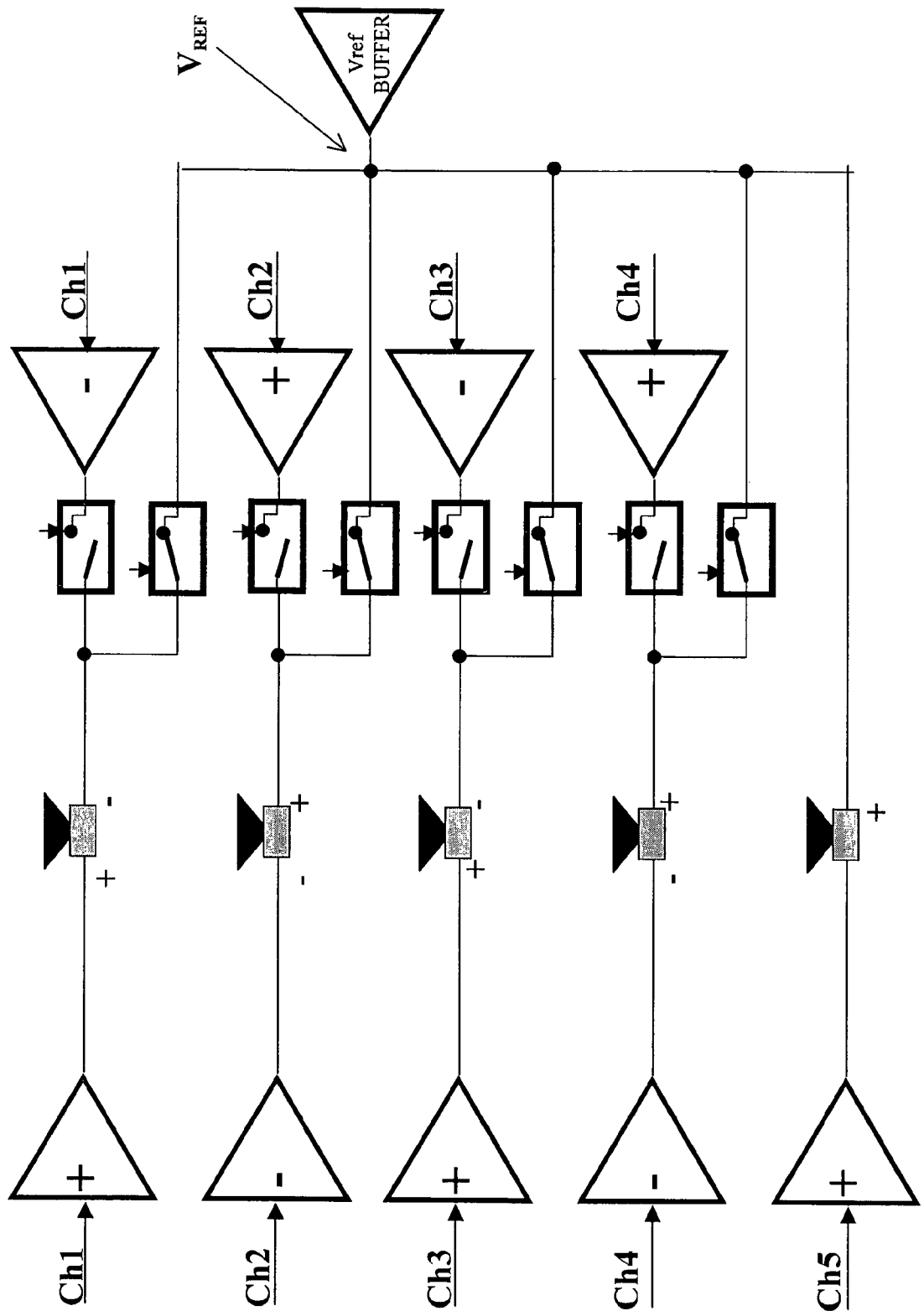
FIG. 5 depicts an amplifier having four channels connectable in single-ended or bridge configuration and a fifth single-ended channel according to an embodiment of this invention.
Figure 6:
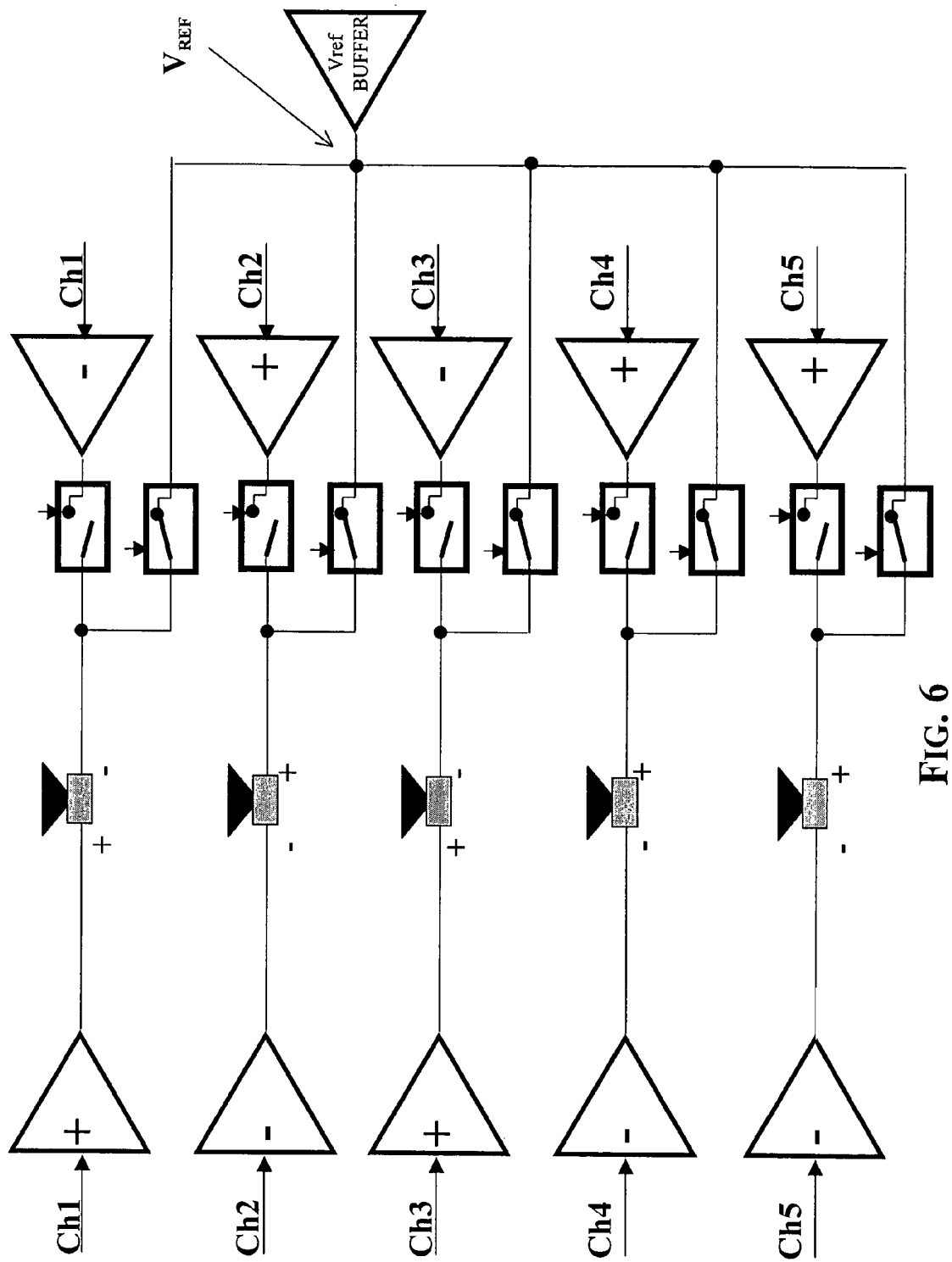
FIG. 6 depicts an amplifier having five channels connectable in single-ended or bridge configuration according to an embodiment of this invention.

A multi-channel power amplifier according to an embodiment of this invention may have any number of channels, as shown in FIGS. 4, 5 and 6, that may be independently switched from a single-ended to a bridge configuration and vice versa, if not designed specifically to function always in single-ended configuration, like channel Ch5 of the amplifier of FIG. 5.

Figure 1:
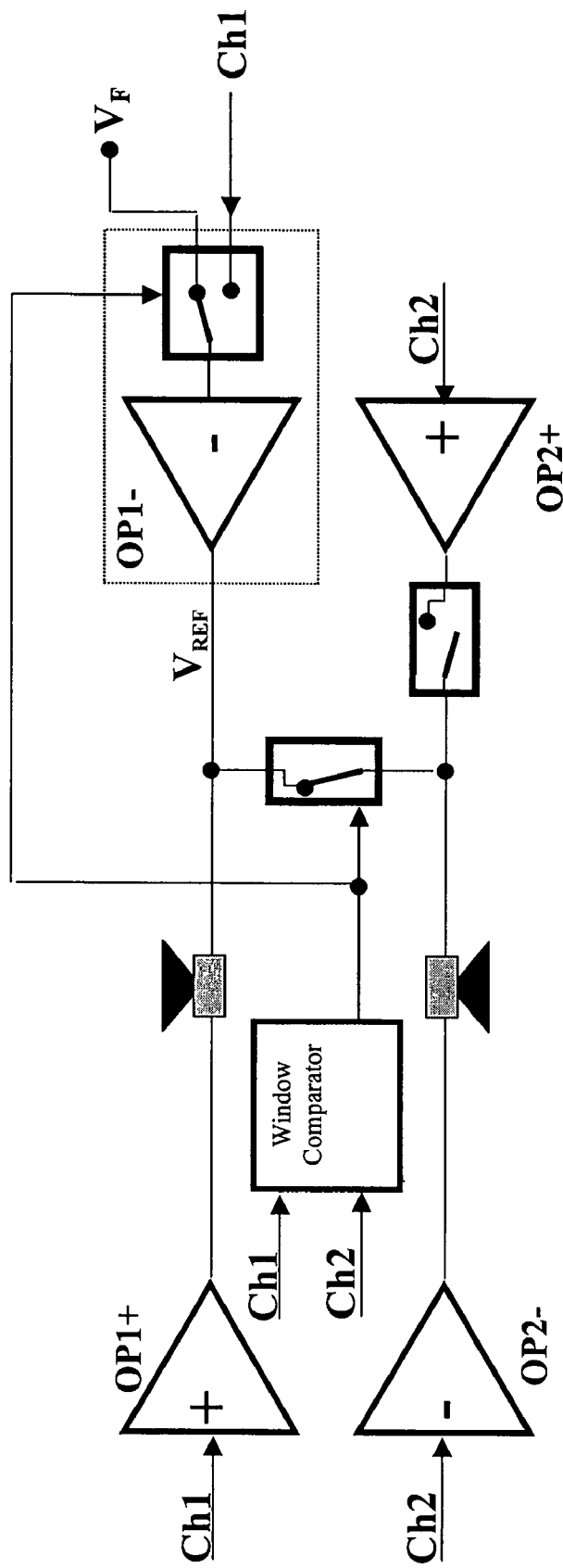
FIG. 1 shows a typical two channel self-configuring power amplifier of the prior art.
Figure 2:
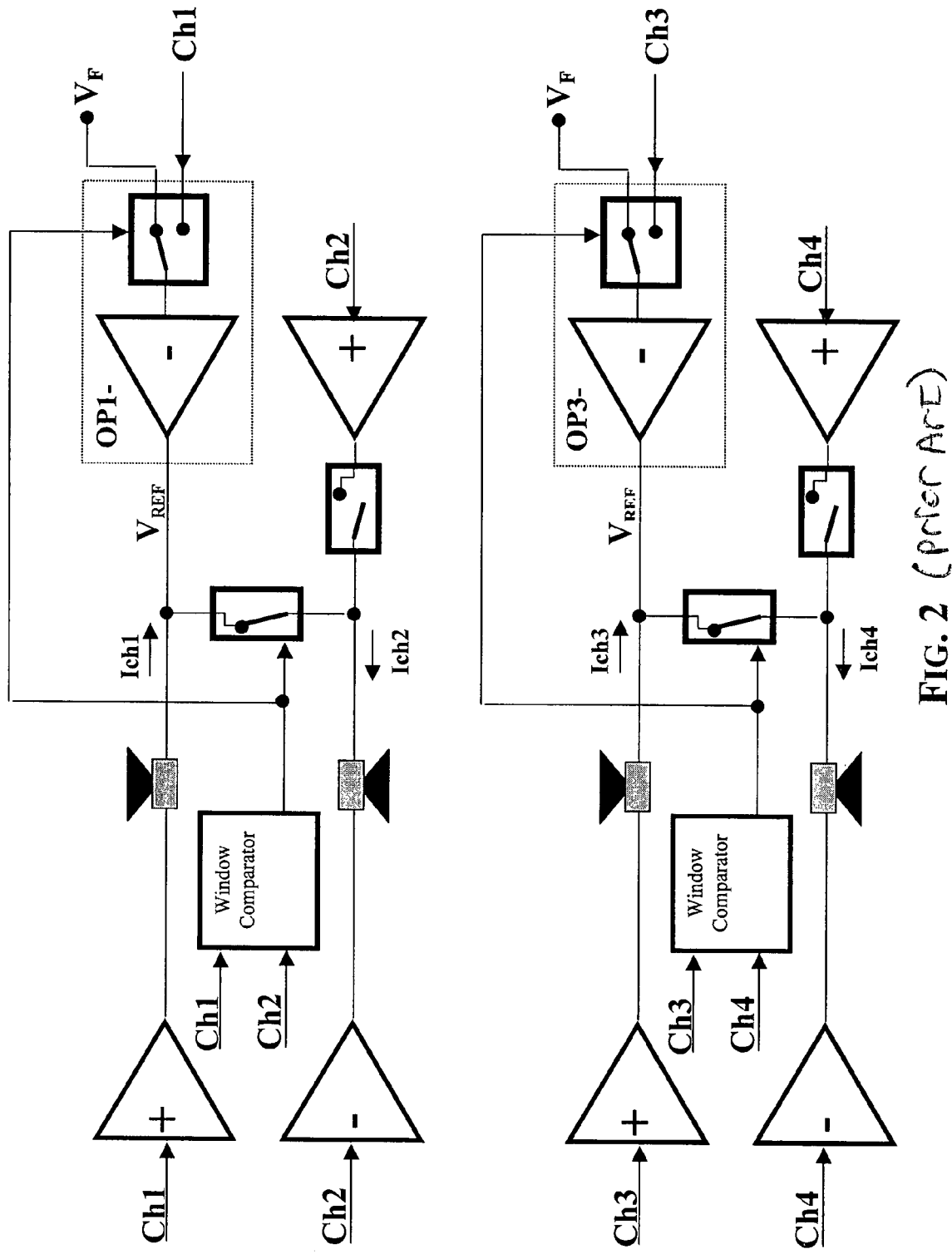
FIG. 2 depicts a pair of two channel power amplifiers of the prior art.

The fact that all single-ended channels are connected to the same voltage reference buffer produces a sensible reduction of power dissipation, because the current absorbed by the buffer Vref_BUFFER when the channels are all single-ended configured, is lower than the sum of the currents absorbed by the buffers of the amplifier of FIG. 2. In fact, the net current flowing in the voltage buffer of a four channel power amplifier of FIG. 4 is $$|Ich1-Ich2+Ich3-Ich4| \quad (1)$$

while in two dual channel power amplifiers of FIG. 2, the net currents absorbed by the operational amplifiers OP1– and OP3– are $$|Ich1-Ich2| \quad (2)$$

and $$|Ich3-Ich4| \quad (3)$$

respectively. Therefore the total current absorbed in the voltage buffers OP1– and OP3–, when all four channels are single-ended, is $$|Ich1-Ich2|+|Ich3-Ich4| \quad (4)$$

which is greater than or at most equal to the net current, given by eq. (1).

In practice, in the power amplifier of this embodiment of the invention the current absorption of a single-ended channel is balanced by all other channels, and not only by the single-ended channel connected to it, as in the power amplifier of FIG. 2.

Figure 7:
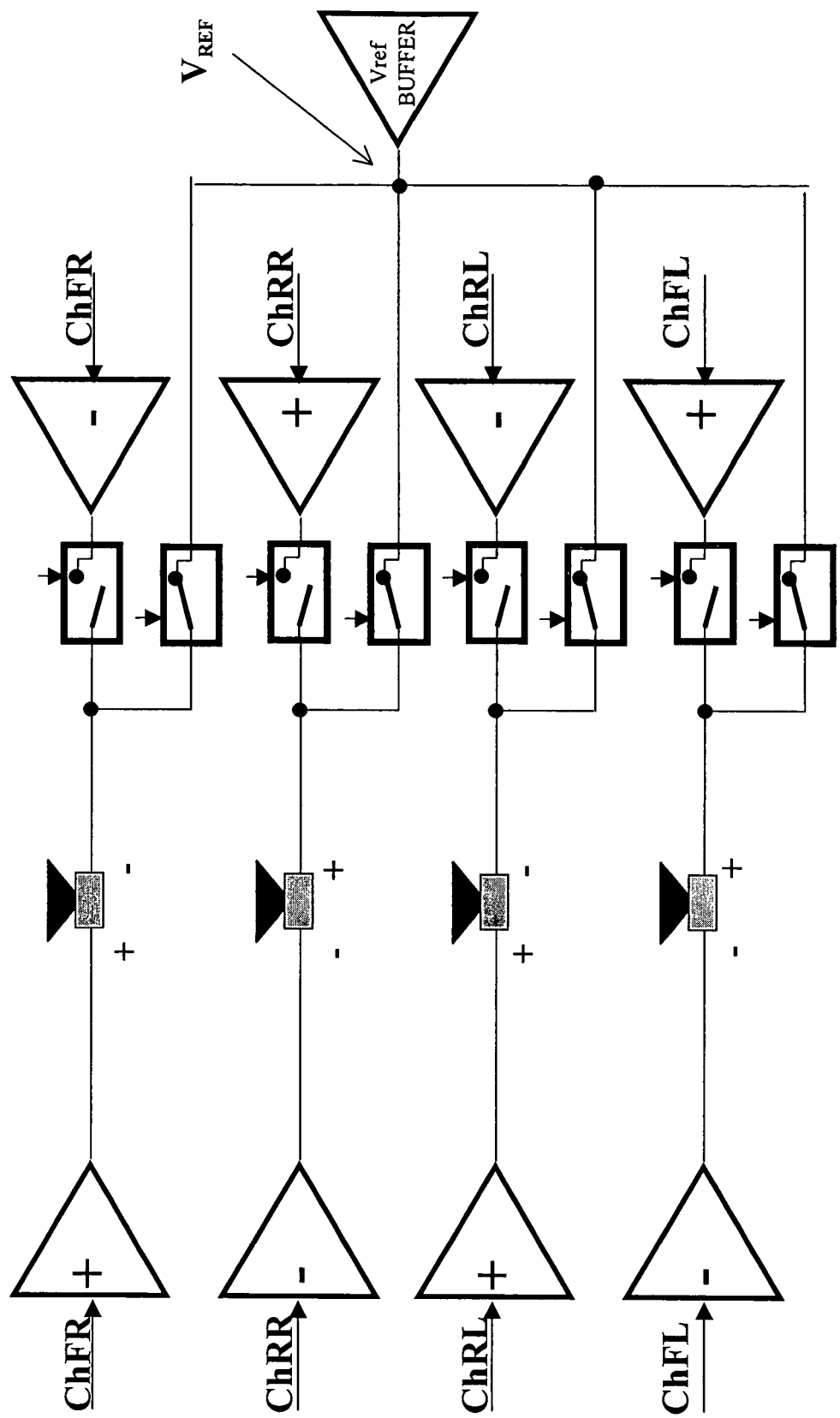
FIG. 7 shows an embodiment of a four channel power amplifier of this invention for car audio applications.

A power amplifier according to an embodiment of this invention particularly suited for car audio applications is depicted in FIG. 7. It is substantially composed of four channels ChFR, ChRR, ChRL and ChFL driving a front right, rear right, rear left and front left loudspeakers, respectively.

In order to minimize power consumption, audio signals are fed to the inverting (or non inverting) inputs of the first operational amplifiers of the pairs of the front right and rear left channels that are always connected to the respective loads, while the audio signals are fed to the non inverting (or inverting) inputs of the operational amplifiers of the rear right and front left channels.

It has been found that this configuration statistically provides the lowest power dissipation because the currents absorbed by the operational amplifiers of the four channels tend to compensate each other, thus reducing the current absorbed by the voltage buffer.

This fact may be demonstrated mathematically as follows. For sake of simplicity, let us suppose that the front channels are both single-ended, though the same considerations apply even when all four channels are single-ended.

The front right and front left audio signals ChFR and ChFL, respectively, are substantially two random variables whose mean values are null. In the power amplifier of FIG. 7 a current I1 corresponding to the difference between these two audio signals, that is $$I1=ChFR-ChFL \quad (5)$$

flows in the voltage buffer. If the first amplifier of the front left channel received the audio signal ChFL on its non inverting input, a current I2 corresponding to the sum of these two audio signals $$I2=ChFR+ChFL \quad (6)$$

would flow in the buffer Vref_BUFFER.

The mean values of currents I1 and I2 are both null (because the mean values of the audio signals ChFR and ChFL are null) but their variances are different and are given by the following equation $$\mathrm{Var}(ChFR \pm ChFL)=\mathrm{Var}(ChFR)+\mathrm{Var}(ChFL) \pm 2\mathrm{Cov}(ChFR,ChFL) \quad (7)$$

wherein $$2\mathrm{Cov}(ChFR,ChFL)=2\rho\sqrt{\mathrm{Var}(ChFR)\cdot\mathrm{Var}(ChFL)} \quad (8)$$

being $\rho$ the correlation coefficient between the audio signals ChFR and ChFL.

In general, the right signals are substantially in phase with the corresponding left signals, thus it is possible to state that the correlation coefficient $\rho$ is positive. Therefore, $$\mathrm{Var}(I2)=\mathrm{Var}(ChFR+ChFL) \geqq \mathrm{Var}(ChFR-ChFL)=\mathrm{Var}(I1)$$

which means that the current I2 is more likely to be greater than the current I1. For this reason the configuration of FIG. 7 statistically provides the lowest power dissipation in the voltage buffer Vref_BUFFER.

Figure 8:
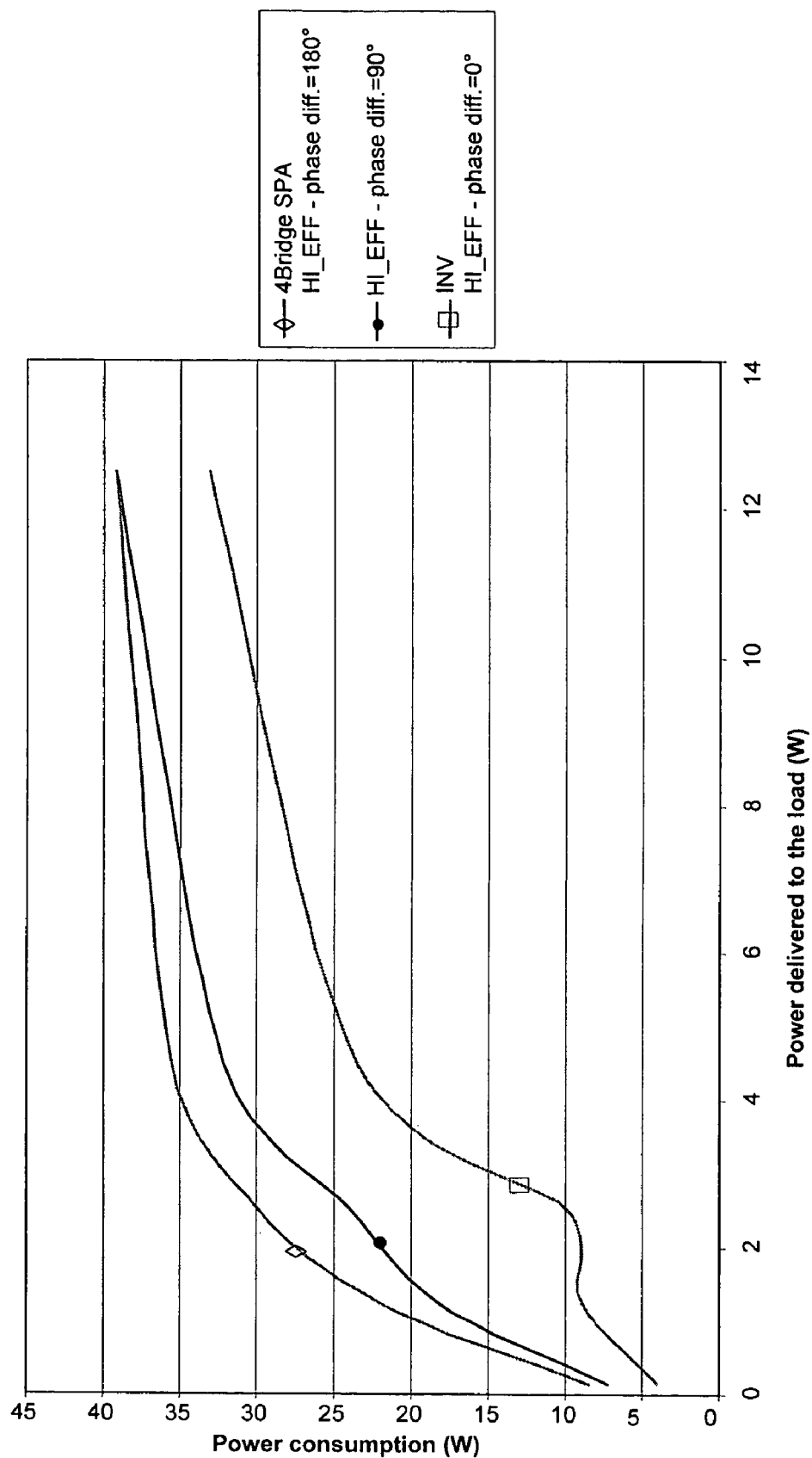
FIG. 8 shows comparison curves of power dissipation of a standard four bridge amplifier, of a known high efficiency self-configuring bridge amplifier, and of a configurable amplifier according to an embodiment of this invention.
Figure 9:
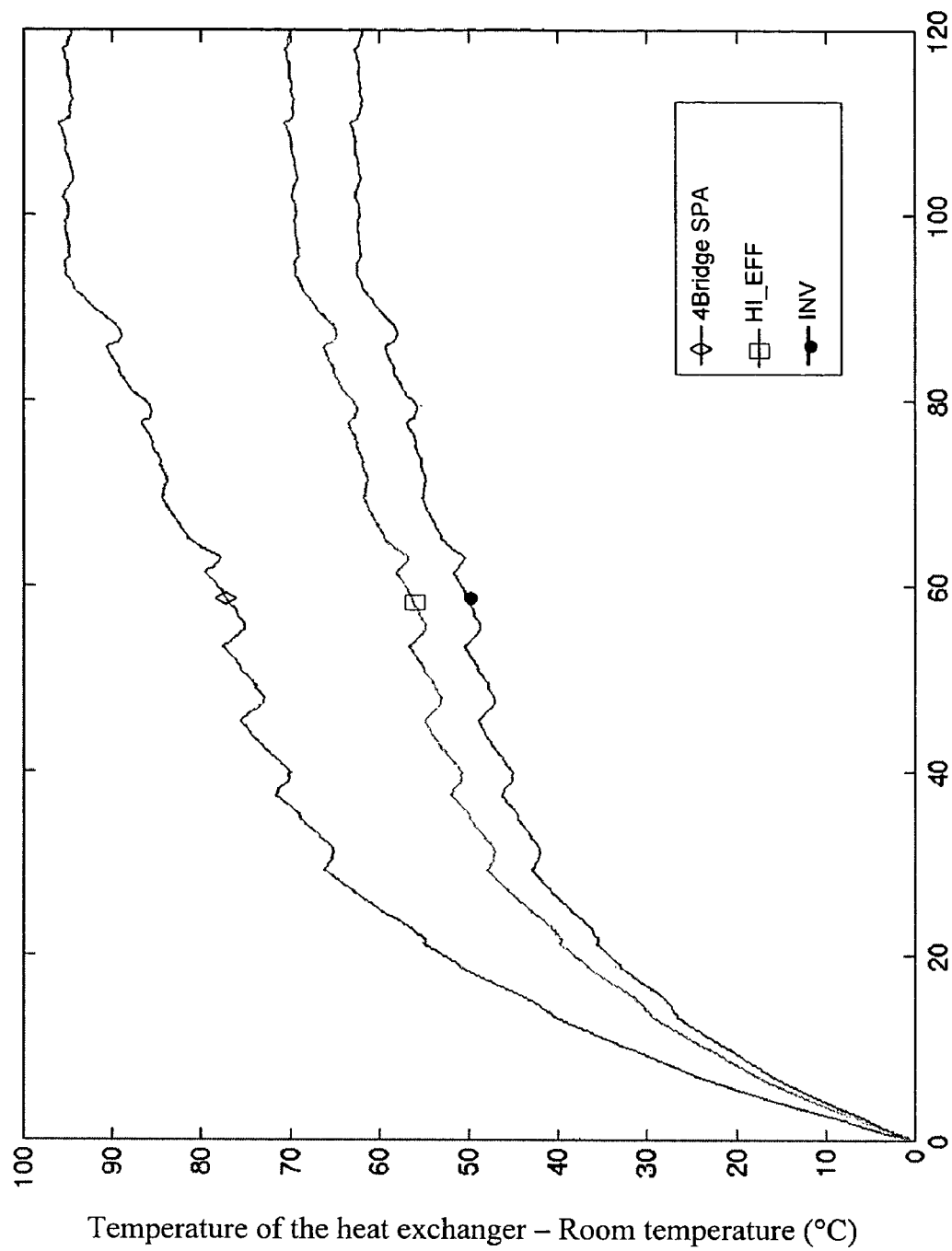
FIG. 9 shows comparison curves of temperature increases over room temperature reached by the heat sink of the power amplifiers of FIG. 8.
Figure 10:
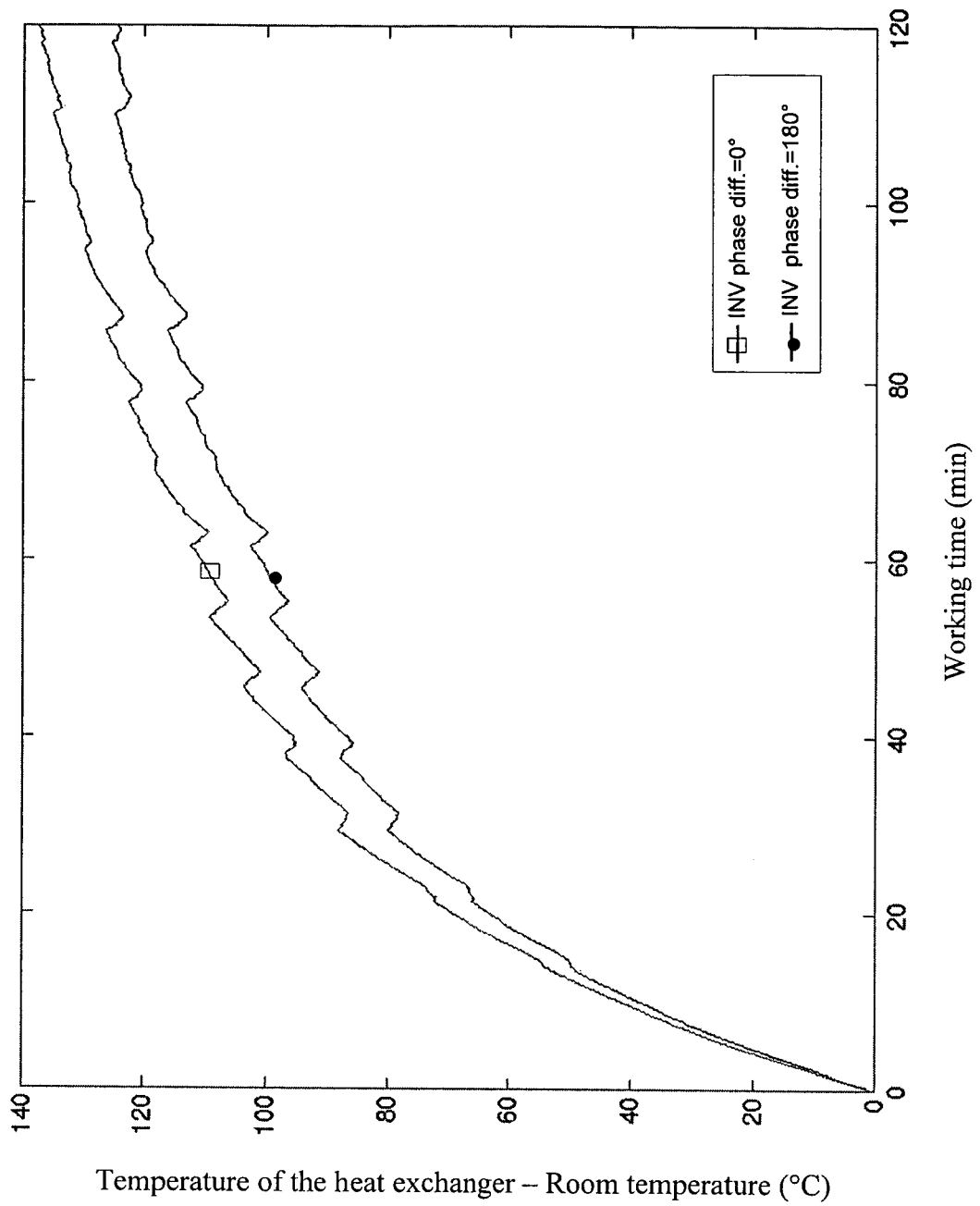
FIG. 10 shows comparison curves of the temperature increase over room temperature of the heat sink of a power amplifier according to an embodiment of this invention for car audio applications, when the right and left audio signals are in-phase and out-phased by 180°.

FIGS. 8, 9, and 10 show results of simulations of a four channel power amplifier according to an embodiment of this invention with a standard four bridge power amplifier, that is a four bridge power amplifier composed of standard class AB operational amplifiers, and with a high efficiency self-configuring power amplifier according to the prior art, carried out with the software program MATLAB™.

More specifically, in FIG. 8 are shown the power consumption characteristics of the compared power amplifiers in function of the power delivered to the load for certain values of phase difference. The power amplifiers have four channels driven with sine signals of the same amplitude and each supplying four loads of 4Ω.

The first curve, identified with the symbol "◊", refers to a four channel standard power amplifier (SPA) regardless of what the phase difference between the input audio signals of the channels is. The same curve also refers to a self-configuring four channels high efficiency power amplifier (HI_EFF) of the prior art, as depicted in FIG. 2 when the front and rear channels are outphased by 180°. The second curve, identified with the symbol "•", refers to the same self-configuring four channel high efficiency power amplifier (HI_EFF) of FIG. 2, when the front and rear channels are outphased by 90°.

Finally, the third curve, identified with the symbol "□", refers to the same four channel high efficiency power amplifier (HI_EFF) of the prior art when the input audio signals of the rear and front channels are in phase. The same curve also refers to the self-configuring four channel power amplifier (INV) as depicted in FIG. 7 regardless of what the phase difference between the input audio signals of the front and rear channels is.

In practice, in the self-configuring power amplifier of the prior art of FIG. 2, the current absorbed by a front (rear) channel may be compensated only by the current flowing in the rear (front) channel connected to it when it is in phase thereto, but when the currents in the front and rear channels are in phase opposition, the total current absorbed by each voltage buffer OP1– and OP3– is twice the current circulating in each channel.

By contrast, in a power amplifier according to an embodiment of this invention, when the front and rear channels are in phase-opposition, the current in the front (rear) left channel compensates the current in the front (rear) right channel, and thus even in this case the current absorbed by the voltage buffer Vref_BUFFER is practically null.

In FIG. 9, the temperature increases in the heat sink of a standard four channel power amplifier (SPA), of a known self-configuring four channel high efficiency power amplifier (HI_EFF), and of a self-configuring four channel power amplifier according to an embodiment of this invention (INV) are shown. The supplied loads were four loudspeakers and the audio signals input to the front and rear channels were outphased by 3 ms.

Even in this embodiment, it is evident that the power dissipation of the power amplifier of this invention is significantly lower than that of known amplifiers.

Finally, in FIG. 10, are shown the performances of the power amplifier according to an embodiment of this invention as depicted in FIG. 7 when the audio signals input to the (front and rear) left channels are in phase with the audio signals input to the (front and rear) right channels and when there is a phase difference of 180°. For this test the front and rear channels were outphased by 3 ms and each channel had a 4Ω load.

Once again the results confirm that connecting all the channels to the same voltage buffer produces a sensible power saving, because the current absorbed by a single-ended channel is balanced by the currents absorbed by other single-ended channels and not only by the current flowing in the respective front or rear channel connected to it, as in the known power amplifier of FIG. 2.

The circuits of FIGS. 4-7 may be disposed on one or more respective integrated circuits, which may be incorporated in electronic systems such as a car radio.

From the foregoing it will be appreciated that, although specific embodiments of the invention have been described herein for purposes of illustration, various modifications may be made without deviating from the spirit and scope of the invention.

What is claimed is:

1. A multi-channel power amplifier for driving a plurality of loads, each associated with a respective channel, each channel comprising a pair of operational amplifiers, first and second, one operational amplifier of each channel being connectable through switches either in a bridge configuration with the other operational amplifier or in single-ended configuration to a constant reference voltage for driving the load of the respective channel such that at least one channel is operable to be in said differential configuration while at least one other channel is operable to be in said single-ended configuration, the amplifier further comprising at least a window comparator for monitoring the signal level and outputting a logic control signal for said switches, wherein the power amplifier comprises:

a unique voltage buffer, distinct from said operational amplifiers, outputting said constant reference voltage;

the output of each channel is configurable independently from the output of the other channels;

each channel includes a dedicated window comparator monitoring the level of the signal input to the channel and generating logic control signals for positioning the output configuring switches of the channel.

2. The multi-channel power amplifier of claim 1, further comprising at least a channel comprising an operational amplifier always connected in single-ended configuration.

3. The multi-channel power amplifier of claim 1, wherein said operational amplifiers are all of class AB.

4. The multi-channel power amplifier of claim 1, wherein at least said other operational amplifiers of the channels have a normal functioning state in which they deliver current to the respective load and a high impedance functioning state in which their output current is substantially null, said windows comparators switching to a high impedance state said other operational amplifiers for configuring the output of the respective channels in a single-ended configuration.

5. The multi-channel power amplifier for stereo applications according to claim 1 and comprising four channels: first, second, third and fourth, respectively driving a front right loudspeaker, a rear right loudspeaker, a front left loudspeaker and a rear left loudspeaker, wherein to the said one operational amplifier of the pair of said channels first and fourth are fed respective audio signals on either an inverting input node or on a non inverting input node, while to the said one operational amplifier of the pairs of said channels third and second are fed respective audio signals on either a non inverting input node or on an inverting input node.

6. A power amplifier for driving multiple loads each having two respective terminals, the amplifier comprising:

multiple respective channels each operable to drive a respective one of the loads in a differential manner and in a single ended manner during differential and single ended operating modes, respectively; and a reference circuit coupled to the channels and operable to maintain at a reference voltage a terminal of each load that a respective one of the channels is driving in a single-ended manner while at least one other channel is driving a respective load in a differential manner.

7. The power amplifier of claim 6 wherein each of the channels is operable to receive a respective input signal having a parameter and includes a respective mode circuit operable to switch the channel between the differential and single-ended modes based on the parameter of the input signal.

8. The power amplifier of claim 6 wherein each of the channels comprises:

a first drive stage having a first drive node coupled to a first node of a respective load;

a second drive stage having a second drive node; and a respective mode circuit coupled to the reference circuit and operable to, couple the second drive node to a second node of the respective load while the channel is operating in the differential mode, and uncouple the second drive node from and couple the reference voltage to the second node of the load while the channel is operating in the single ended mode.

9. The power amplifier of claim 6 wherein each of the channels comprises:

a first drive stage having a first drive node coupled to a first node of a respective load;

a second drive stage having a second drive node coupled to a second node of the load; and a respective mode circuit coupled to the reference circuit and operable to cause the second drive node to electrically float and to couple the reference voltage to the second node of the load while the channel is operating in the single ended mode.

10. An electronic system, comprising:

multiple loads each having two respective terminals;

multiple respective channels each operable to drive a respective one of the loads in a differential manner and in a single ended manner during differential and single ended operating modes, respectively; and a reference circuit coupled to the channels and operable to maintain at a reference voltage a terminal of each load that a respective one of the channels is driving in a single-ended manner while at least one other channel is driving a respective load in a differential manner.

11. The electronic system of claim 10 wherein:
the loads comprise respective speakers;
four of the channels each include,
first polarity and second polarity input nodes,
a respective first drive stage coupled to one of the input nodes and having a first drive node coupled to a first node of a respective load,
a second drive stage coupled to the other input node and having a second drive node coupled to a second node of the load, and
a respective mode circuit coupled to the reference circuit and operable to couple the reference voltage to the second node of the load while the channel is operating in the single ended mode;
the first polarity input node of a first one of the four channels is operable to receive a front right signal and is coupled to the first drive stage of the first channel;
the first polarity input node of a second one of the channels is operable to receive a rear left signal and is coupled to the first drive stage of the second channel;
the second polarity input node of a third one of the channels is operable to receive a rear right signal and is coupled to the first drive stage of the third channel; and
the second polarity input node of a fourth one of the channels is operable to receive a front left signal and is coupled to the first drive stage of the fourth channel.

12. An electronic system, comprising:
four speakers each having two respective terminals;
four channels each operable to drive a respective one of the speakers in a differential manner and in a single ended manner during differential and single ended operating modes irrespective of the operating mode of another channel, respectively, the channels each including,
first polarity and second polarity input nodes,
a first drive stage coupled to one of the input nodes and having a first drive node coupled to a first node of a respective load, and
a second drive stage coupled to the other input node and having a second drive node coupled to a second node of the load, and
a mode circuit operable to couple a reference voltage to the second node of the load while the channel is operating in the single ended mode;
the first polarity input node of a first one of the four channels operable to receive a front right signal and coupled to the first drive stage of the first channel;
the first polarity input node of a second one of the channels operable to receive a rear left signal and coupled to the first drive stage of the second channel;
the second polarity input node of a third one of the channels operable to receive a rear right signal and coupled to the first drive stage of the third channel; and
the second polarity input node of a fourth one of the channels operable to receive a front left signal and coupled to the first drive stage of the fourth channel.

13. A method, comprising:
generating a reference signal with a generator;
driving a first load differentially and with a first circuit other than the generator during a first period;
driving the first load single-endedly with the first circuit and coupling the reference signal to a terminal of the first load during a second period;
driving a second load differentially and with a second circuit other than the generator during the second period; and
driving the second load single-endedly with the second circuit and coupling the reference signal to a terminal of the second load during the first period.

14. The method of claim 13, further comprising:
uncoupling the reference signal from the terminal of the first load during the first period; and
uncoupling the reference signal from the terminal of the second load during the second period.

15. A method, comprising:
differentially amplifying with an amplifier a front right audio signal having a first amplitude if the first amplitude exceeds a first threshold and single endedly amplifying the front right signal with a first phase shift if the first amplitude is less than the first threshold;
differentially amplifying with an amplifier a rear left audio signal having a second amplitude if the second amplitude exceeds a second threshold and single endedly amplifying the rear left signal with the first phase shift if the second amplitude is less than the second threshold;
differentially amplifying with an amplifier a rear right audio signal having a third amplitude if the third amplitude exceeds a third threshold and single endedly amplifying the rear right signal with a second phase shift if the third amplitude is less than the third threshold;
differentially amplifying with an amplifier a front left audio signal having a fourth amplitude if the fourth amplitude exceeds a fourth threshold and single endedly amplifying the front left signal with the second phase shift if the fourth amplitude is less than the fourth thresholds;
wherein at least one signal is being amplified in a differential manner simultaneously to at least one other signal being amplified in a single-ended manner.

16. The method of claim 15 wherein the first phase shift equals the second phase shift plus or minus 180 degrees.

17. The method of claim 15 wherein the first, second, third, and fourth thresholds are equal to one and other.

18. The method of claim 15, further comprising respectively driving first, second, third, and fourth speakers with the amplified front right, rear right, rear left, and front left audio signals.

19. A method, comprising:
generating a reference signal with a generator;
driving single endedly a first load having first and second nodes by coupling the reference signal to the first node and by driving the second node with a first circuit other than the generator; and
driving a second load differentially with a second circuit other than the generator while single endedly driving the first load.

20. The method of claim 19, further comprising:
changing the driving of the first load from single-ended driving to differential driving; and
changing the driving of the second load from differentially driving to single endedly driving.

* * * * *